United States Patent
West et al.

(10) Patent No.: US 7,124,003 B1
(45) Date of Patent: Oct. 17, 2006

(54) DIAGNOSTICS DEVICE FOR TESTING ELECTRICAL CIRCUITS OF A RECREATIONAL VEHICLE

(75) Inventors: Marcus L. West, Yukon, OK (US); Oliver Dale Northup, Guthrie, OK (US); Daniel P. Dooley, Oklahoma City, OK (US)

(73) Assignee: Fifth Wheel Diagnostics, LLC, Madill, OK (US)

( * ) Notice: Subject to any disclaimer, the term of this patent is extended or adjusted under 35 U.S.C. 154(b) by 0 days.

(21) Appl. No.: 10/949,015

(22) Filed: Sep. 24, 2004

(51) Int. Cl.
*G01M 17/00* (2006.01)
*G01R 31/00* (2006.01)

(52) U.S. Cl. .............................. 701/29; 701/31; 324/504

(58) Field of Classification Search .................... 701/1, 701/29, 31, 32, 33, 36; 324/504, 501, 512, 324/527, 537, 753; 73/121; 340/458
See application file for complete search history.

(56) References Cited

U.S. PATENT DOCUMENTS

| 5,095,276 A | 3/1992 | Nepil |
| 5,602,482 A | 2/1997 | Gutierrez |
| 5,990,788 A | 11/1999 | Syracuse |
| 6,081,189 A | 6/2000 | Warner |
| 6,448,779 B1 * | 9/2002 | Beaver et al. ............. 324/504 |
| 6,535,113 B1 | 3/2003 | Gravolin |
| 6,674,288 B1 * | 1/2004 | Gumbel et al. ............ 324/504 |
| 2001/0011891 A1 | 8/2001 | Melendez |

* cited by examiner

*Primary Examiner*—Richard M. Camby
(74) *Attorney, Agent, or Firm*—Daniel P. Dooley; Fellers, Snider, Blankenship, Barley & Tippins

(57) ABSTRACT

Method and apparatus for testing electrical circuits of a recreational vehicle are disclosed. The method incorporates use of a printed circuit board assembly supporting a plurality of vehicle interface contacts; a controller programmed with vehicle diagnostics code that communicates with each vehicle interface contact. Each vehicle interface contact communicates with a corresponding circuit of the recreational vehicle. Each circuit of the recreational vehicle is operatively responsive to an execution by the controller of a corresponding portion of a vehicle diagnostics code. The method includes steps of plugging an electrical-systems utility plug of the recreational vehicle into an electrical system diagnostics device; automatically determining an operative status of a battery of a battery circuit of the recreational vehicle; and confirming that a turn signal circuit of the recreational vehicle, cooperating with the electrical system diagnostics device, operates to provide a flashing hazard warning circuit for the recreational vehicle.

30 Claims, 4 Drawing Sheets

US 7,124,003 B1

DIAGNOSTICS DEVICE FOR TESTING ELECTRICAL CIRCUITS OF A RECREATIONAL VEHICLE

BACKGROUND OF THE INVENTION

1. Field of the Invention

The present invention relates to a diagnostics device for testing electrical circuits. More particularly, but not by way of limitation, the present invention relates to a diagnostics device for testing electrical circuits of a recreational vehicle including: running lights, including tail lights; brake lights; turn signals; back-up lights; hazard warning lights; and an emergency brake circuit of the recreational vehicle.

2. Background of the Invention

The popularity and use of recreational vehicles has continued to expand over the past few decades. In particular, towable vehicles referred to as "Fifth Wheels" have gained market share. A fifth wheel is a type of recreational vehicle that utilizes the bed of a pickup truck as an attachment point.

Attaching the tongue of the fifth wheel to the bed of the pickup improves: the distribution of the load on the pickup; the stability and handling of the pickup; the ability to maneuver the fifth wheel; and enhances the ergonomics of layout of the recreational vehicle.

During the process of securing the fifth wheel to the bed of the pickup, an electrical plug of the fifth wheel is connected to an electrical interface connector of the pickup. Once the electrical plug is connected to the electrical interface connector of the pickup, the electrical running circuits of the fifth wheel are operative. Included among the running circuits are: turn signals; brake lights; running lights, including tail lights; backup lights; hazard warning lights (which typically comprises the turning signals flashing in unison). However, during typical usage of the fifth wheel, activation, operation, and control of the running circuits dependent on the inputs from the pickup conducted through the electrical interface connector. The result of the dependency of the fifth wheel on the pickup has at least two facets. First, confirmation of the operative status of each electrical running circuit generally entails walking around the recreational vehicle to acquire a visual confirmation of the operability of each circuit following a manual activation of each circuit via controls of the pickup; and second, self activation of the hazard warning lights by the recreational vehicle, is beyond the capabilities of the recreational vehicle. As such, challenges remain and a need persists for improvements in techniques and devices used for confirming the operability of the electrical running circuits of recreational vehicle; and for stand alone operation of hazard warning lights of a recreational vehicle, to which the present invention is directed.

SUMMARY OF THE INVENTION

In accordance with preferred embodiments, a method and device for testing electrical circuits of a recreational vehicle are claimed. In a first embodiment, the device preferably includes: a printed circuit board assembly supporting a plurality of vehicle interface contacts; a controller programmed with vehicle diagnostics code, the controller mounted to the printed circuit board assembly and communicating with each vehicle interface contact; and a plurality of circuits of a recreational vehicle, each circuit communicating with a corresponding vehicle interface contact and operatively responsive to an execution by the controller of the vehicle diagnostics code, wherein the plurality of circuits include: a battery circuit selectively operating an emergency brake system circuit of the recreational vehicle, wherein the controller automatically detects a presence of a battery of the battery circuit and executes the diagnostic code to automatically determine a voltage and operative status of the battery; and a turn signal circuit with a pair of turn signal lights mounted to the exterior of the recreational vehicle, and wherein the controller selectively operates the turn signal circuit as a flashing hazard warning circuit is claimed.

A second embodiment preferably includes an optional battery pack in addition to the functions and features of the first preferred embodiment.

A third embodiment preferably provides a method for confirming an operating status of circuits of the recreational vehicle of the first, or second preferred embodiment be steps that include: plugging an electrical-systems utility plug of a recreational vehicle into an electrical system diagnostics device; automatically determining an operative status of a battery of a battery circuit of said recreational vehicle with said electrical system diagnostics device; and confirming a turn signal circuit of said recreational vehicle cooperating with said electrical system diagnostics device operates in combination to provide a flashing hazard warning circuit for said recreational vehicle.

A fourth embodiment preferably provides a method for programming values of a variables table of a diagnostic code executed by a controller of the device of the first, or second preferred embodiment by steps that include: plugging an electrical-systems utility plug of a recreational vehicle into an electrical system diagnostics device; automatically determining an operative status of a battery of a battery circuit of said recreational vehicle with said electrical system diagnostics device; confirming a turn signal circuit of said recreational vehicle cooperating with said electrical system diagnostics device operates in combination to provide a flashing hazard warning circuit for said recreational vehicle during an application of a substantially constant voltage across said flashing hazard warning circuit; measuring a value of a current level draw by said flashing hazard warning circuit during said application of said substantially constant voltage; and storing said measured value in a variables table of a diagnostics code of said electrical system diagnostics device.

These and various other features and advantages which characterize the claimed invention will be apparent from reading the following detailed description and a review of the associated drawings.

DESCRIPTION OF THE PREFERRED EMBODIMENTS

Before explaining the present invention in detail, it is important to understand that the invention is not limited in its application to the details of the construction illustrated, or by the steps of construction inherently present by way of illustration of the appended drawings. The invention is capable of other embodiments and of being practiced or carried out in a variety of ways. It is to be understood that the phraseology and terminology employed herein is for the purpose of description and does not impose limitation on the present invention.

Figure 1:
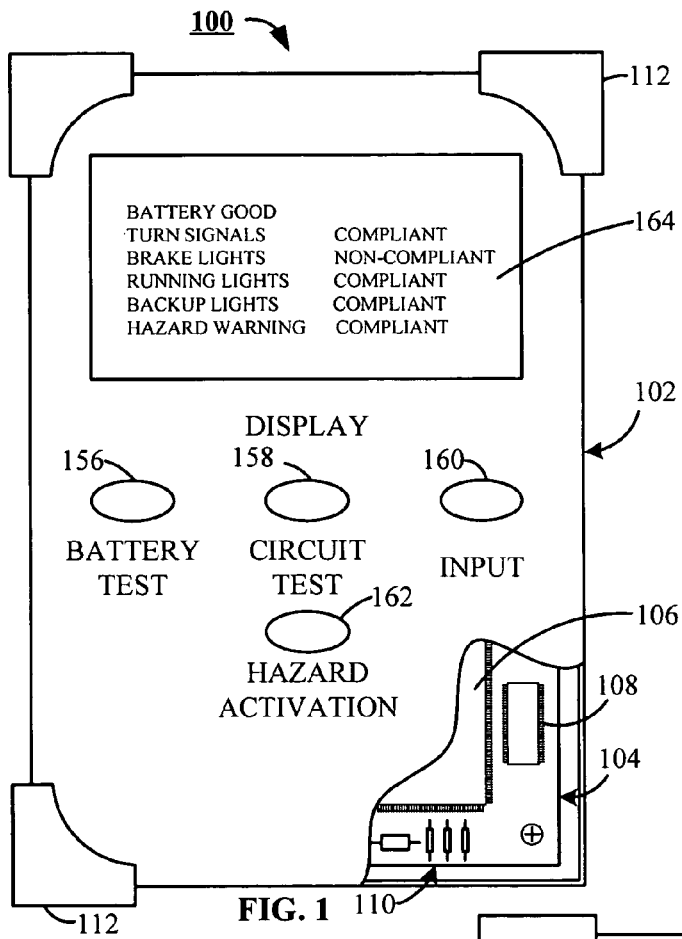
FIG. 1 shows a front plan view of a diagnostics device of the present invention for testing electrical circuits of a recreational vehicle.

Referring now to the drawings, wherein like reference numerals indicate the same parts throughout the several views, an embodiment of a diagnostics device ("DD") 100 for testing electrical circuits of a recreational vehicle is shown in FIG. 1. Not by way of limitation, but by way of illustration only, the DD 100 is particularly useful for verifying an operative status of electrical circuits of a recreational vehicle. Typically, the DD 100 includes a housing 102 supporting a printed circuit board assembly ("PCBA") 104 (shown in partial cutaway). The housing 102, discussed in greater detail herein-below, may be constructed from composites, polymers, or other suitable material, and preferably takes the form of a ridged structure assembled from a plurality of components. The PCBA 104, discussed in greater detail herein-below, typically includes at least a controller 106 with onboard memory, a display driver 108, and a voltage control circuit 110 (partially shown). In a preferred embodiment, the housing 102 further includes a plurality of integrated mechanical shock disbursement members 112.

Figure 2:
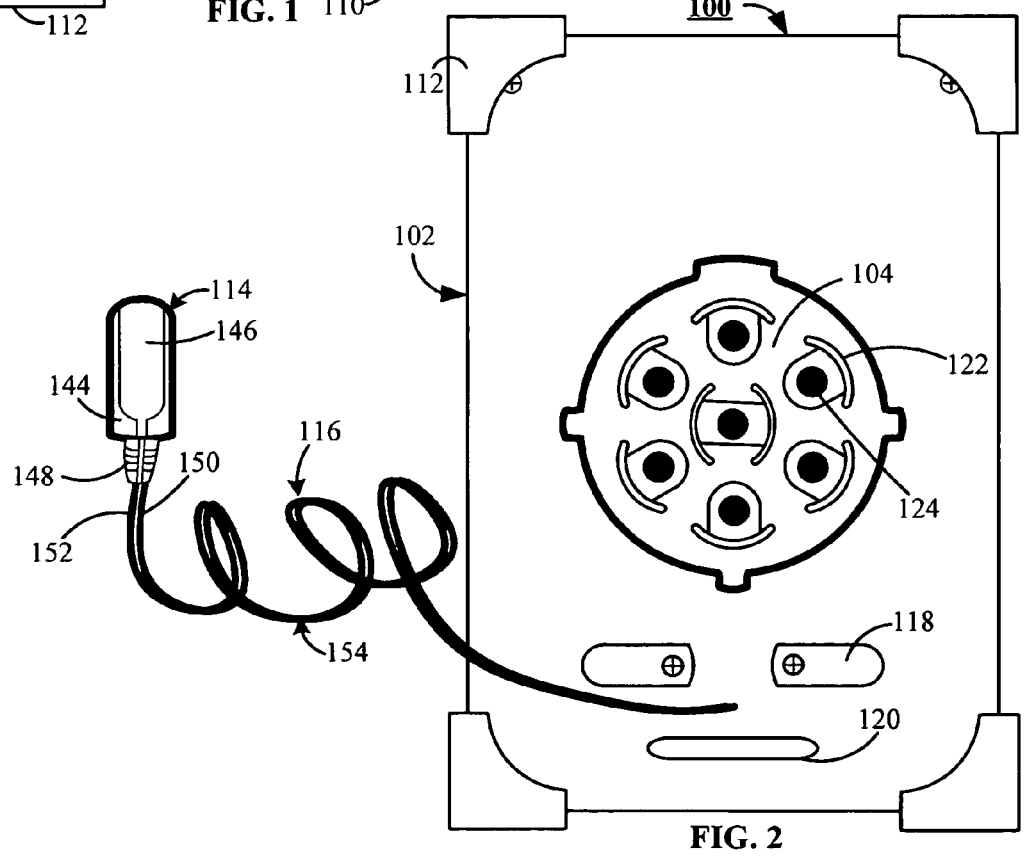
FIG. 2 provides a rear plan view of the diagnostics device of FIG. 1.

FIG. 2 shows an emergency brake interface contact 114 tethered to a conductive cable 116, The conductive cable 116 is supported by the housing 102 and communicates with the PCBA 104. During non-use of the emergency brake interface contact 114, the conductive cable 116 is wound around a pair of cable retention members 118, and the emergency brake interface contact 114 is stowed in a paddle confinement aperture 120. The function and operation of the emergency brake interface contact 114 will be covered in greater detail during the discussion of FIG. 3. Continuing with FIG. 2, further shown therein is a plurality of vehicle interface contacts 122 supported by the housing 102. In a preferred embodiment, each vehicle interface contact 122 forms an electrical connection with the PCBA 104 via a conductive fastener, such as a rivet 124. Following a process of plugging in an electrical-systems utility plug of a recreational vehicle 126 (of FIG. 3) into the DD 100, each vehicle interface contact 122 forms an electrical contact with a corresponding electrical circuit of the recreational vehicle 126.

Figure 3:
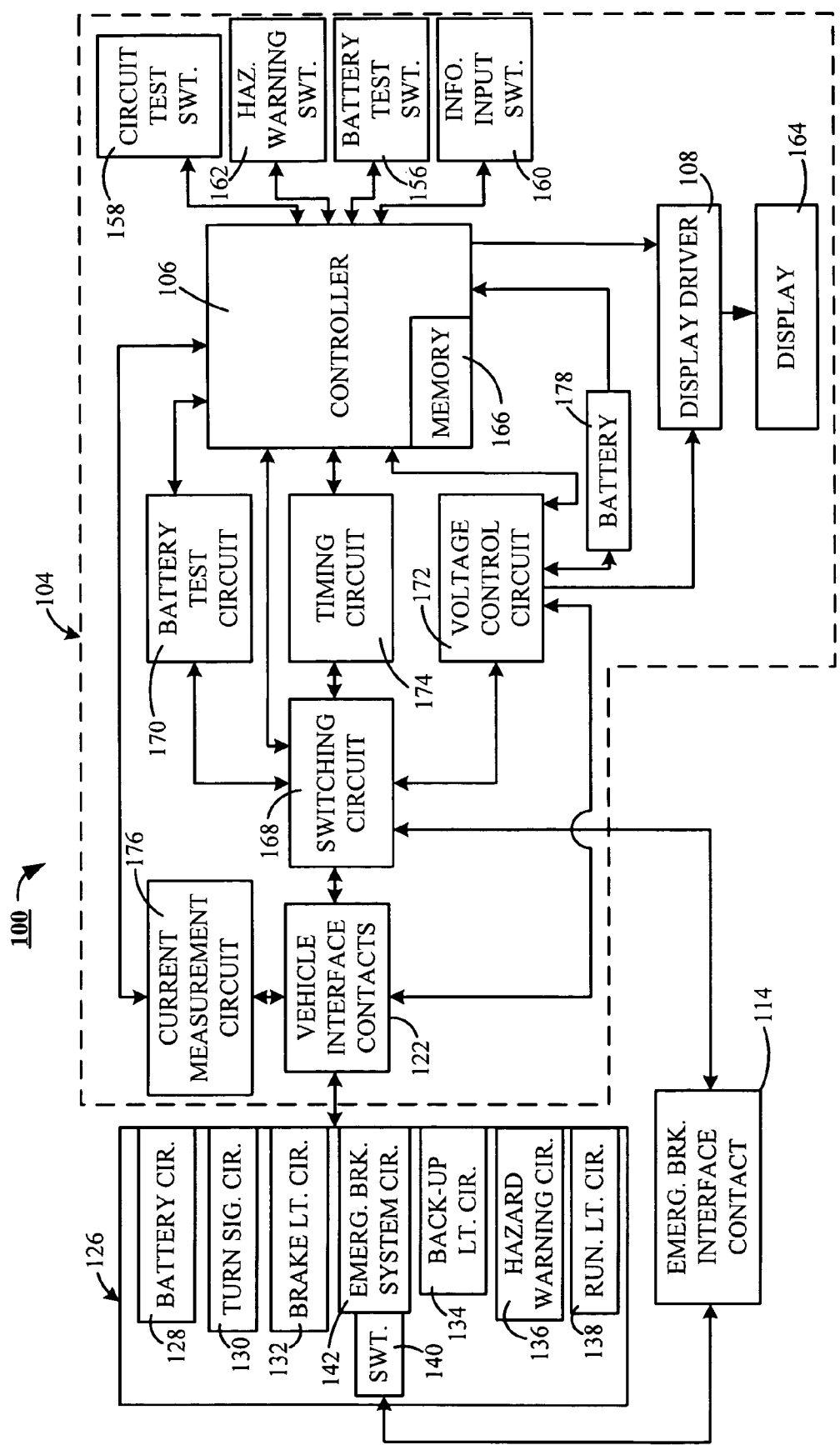
FIG. 3 is a functional block diagram of a circuit for controlling operation of the diagnostics device of FIG. 1, the circuit programmed with a vehicle diagnostics code for testing the electrical circuits of the recreational vehicle.

As shown by FIG. 3, the electrical circuits of the recreational vehicle 126 corresponding to each of the plurality of vehicle interface contacts 122 (shown in greater detail by FIG. 2) preferably include: a battery circuit 128; a first turn signal circuit 130; a brake light circuit 132; a back-up light circuit 134; a second turn signal circuit (not shown separately), which in cooperation with the first turn signal circuit 130 and the DD 100 combine to form a flashing hazard warning circuit 136; and a running light circuit 138 that includes a tail light (not shown separately) mounted to the recreational vehicle 126.

FIG. 3 further shows that the emergency brake interface contact 114 communicates with an emergency switch 140 of an emergency brake system circuit 142. In a preferred embodiment, during normal use of a towable recreational vehicle (such as 126) equipped with a battery circuit (such as 128) and an emergency brake system circuit (such as 142), a nonconductive paddle (not shown) is interposed between contacts (not shown separately) of an emergency switch (such as 140). The nonconductive paddle is tethered to a trip line, and the trip line is attached to the vehicle towing the recreational vehicle. If the recreational vehicle becomes inadvertently detached from the towing vehicle, the trip line becomes taut, causing the paddle to be retracted from the contacts of the emergency switch, thereby allowing the contacts to engage and activate the recreational vehicle's emergency brake system circuit. A solenoid (not shown) communicating with the emergency brake system circuit responds to the activation of the recreational vehicle's emergency brake system circuit by engaging brake shoes (not shown) of a braking system (not shown) of the recreational vehicle.

Returning to FIG. 2, the emergency brake interface contact 114 includes a nonconductive core portion 144 supporting a pair of conductive pads 146 (only one shown). The conductive cable 116 includes a strain relief portion 148; a first conductive strand 150; and a second conductive strand 152. The first and second conductive cable strands (150 and 152) are separated from each other, and protected from interaction with an external environment, by an insulating sheath 154. Turning back to FIG. 3, during testing of the emergency brake system circuit 142, the emergency brake interface contact 114 is interposed between contacts (not shown separately) of the emergency switch 140. Each conductive pad 146 (of FIG. 2) forms an electrical connection with its corresponding contact of the emergency switch 140. In a preferred embodiment, there is not a requirement regarding which conductive pad 146 communicates with which contact of the emergency switch 140. The emergency brake interface contact 114 may be interposed between the contacts of the emergency switch 140 in one of two orientations, without imposing a hindrance on an ability to test the emergency brake system circuit 142.

With each of the plurality of vehicle interface contacts 122 forming an electrical contact with their corresponding electrical circuits (128–138 respectively), and the emergency brake interface contact 114 forming an electrical connection with the emergency switch 140, testing of the respective electrical circuits (128–138, and 142) of the recreational vehicle 126 may commence. To facilitate testing of the electrical circuits (128–138, and 142), the DD 100 provides: a battery test switch 156; a circuit test switch 158; an information input switch 160; and a hazard warning activation switch 162. It is noted that each said switch (156–160) communicates with a corresponding input contact (not separately shown), which communicates with the controller 106 during diagnostics testing of the electrical circuits (128–138 and 142).

In a preferred embodiment, the DD 100 has an ability to store circuit specific information for up to three separate recreational vehicles. Upon forming an electrical connection between the emergency brake interface contact 114 and each of the plurality of vehicle interface contacts 122 and their respective electrical circuits (128–138, and 142), a display 164 of the DD 100 displays a list of recreational vehicles from which a user chooses, i.e. "RV-1 through RV-3. " By simultaneously pressing the circuit test switch 158 and the information input switch 160 (see FIG. 1), the user can scroll to the recreational vehicle the user is interested in testing, or for which the user is interested in establishing baseline measurements.

Typically, there are two cases for which a user is interested in establishing baseline measurements. Either the recreational vehicle of interest has not previously undergone diagnostics testing, or a change in the recreational vehicle has occurred, such as the battery (not separately shown) of the battery circuit 128 has been changed out, and the user wishes to re-establish baseline measurements of the recreational vehicle of interest. For the situation in which the recreational vehicle of interest has not previously undergone diagnostics testing, upon scrolling to the recreational vehicle of interest, the user depresses the information input switch 160. If the user wishes to re-establish a new baseline for a previously tested recreational vehicle, upon scrolling to the recreational vehicle of interest, the user simultaneously depresses both the information input switch 160 and the battery test switch 156 (see FIG. 1). The simultaneous depression of both the information input switch 160 and the battery test switch 156 clears all values stored in a variables table of a vehicle diagnostics code resident in a memory 166 of the controller 106, that are associated with the recreational vehicle of interest.

In a preferred embodiment, it is noted that among the plurality of vehicle interface contacts 122 are a charge line contact (used for charging a battery of the battery circuit 128 while the recreational vehicle 126 is in use and being towed), and a ground line contact (used for completing the respective electrical circuits (128–138, and 142)). For example, if an operator of a tow vehicle actively attached to the recreational vehicle 126 depresses the brake paddle of the tow vehicle, a signal is sent to the brake light circuit 132 (which is connected in series between a select one of the vehicle interface contacts of the tow vehicle and the ground line contact of the tow vehicle), and a brake light of the brake light circuit 132 illuminates. Because the charge line contact of the plurality of vehicle interface contacts 122 is connected to a positive terminal of the battery of the battery circuit 128, and the ground line contact of the plurality of vehicle interface contacts 122 is connected to a negative terminal of the battery of battery circuit 128, the power needed to test the respective electrical circuits (128–138, and 142) of the recreational vehicle 126 is provided by the battery of the battery circuit 128. As such, the battery circuit 128 of the recreational vehicle 126 is the first circuit tested.

For an initial testing of the battery circuit 128 of the recreational vehicle 126, the user: connects the emergency brake interface contact 114; connects each of the plurality of vehicle interface contacts 122 of the DD 100 to their respective electrical circuits (128–138, and 142); selects a recreational vehicle 126 of interest from a list of recreational vehicles, i.e. "RV-1 through RV-3," displayed by the display 164 of the DD 100; and activates the battery test switch 156. Upon activation of the battery test switch 156, the controller 106 executes a battery test portion of the vehicle diagnostics code resident in the memory 166. The controller 106 instructs a switching circuit 168 to switch in the ground line and the charge line of the battery of the battery circuit 128. The controller then instructs a battery test circuit 170 to measure a voltage level of the battery to identify the battery type, i.e., whether the battery supports a 6, 12, or 45 volt system. With the type of battery identified, the battery test circuit 170 applies a load of predetermined resistance across the battery for a predetermined period of time. At the conclusion of the predetermined period of time, a voltage control circuit 172 in combination with a timing circuit 174 measures a recovery time for the battery to achieve a predetermined voltage level. Preferable, the user compares the voltage recovery profile to a voltage recovery profile provided by the supplier of the battery. If the measured voltage recovery profile compares favorably with the voltage recovery profile provided by the supplier, the user depresses the information input switch 160 and the measured battery recovery profile is stored in the variables table of the vehicle diagnostics code resident in the memory 166 of the controller 106.

During subsequent testing of the battery circuit 128, the test procedure proceeds as described hereinabove with the following exception. Following the identification of the battery type, and measurement of the voltage recovery profile, the controller 106 compares the measured voltage recovery profile to the voltage recovery profile stored in the variables table. If during the recovery period the battery attains between 90 and 100% of the voltage value stored in the variables table, the controller 106 will direct the display driver 108 to display the term "Battery Good" on the display 164, and the user is permitted to proceed with the testing of the balance of the circuits of the recreational vehicle 126.

If during the recovery period the battery attains between 75 and 90% of the voltage value stored in the variables table, the controller 106 will direct the display driver 108 to display the term "Battery Fair" on the display 164, and the user is permitted to proceed with the testing of the balance of the circuits of the recreational vehicle 126. In a preferred embodiment, the term "Battery Fair" signifies that the battery will likely recharge to its full voltage level during active use of the recreational vehicle 126. If during the recovery period the battery attains between 50 and 75% of the voltage value stored in the variables table, the controller 106 will direct the display driver 108 to display the term "Battery Poor" on the display 164, and the user is permitted to proceed with the testing of the balance of the circuits of the recreational vehicle 126, but is advised that the results from the subsequent circuit tests should be visually verified and confirmed by depressing the information input switch 160 following the visual verification. In a preferred embodiment, the term "Battery Poor" signifies that the battery should be charged with a stationary charger and retested. If following the retest of the battery a "Battery Good" term is not displayed on the display 164, the user is advised to change the battery of the recreational vehicle 126.

If during the recovery period the battery attains less than 50% of the voltage value stored in the variables table, the controller 106 will direct the display driver 108 to display the term "Battery Dead" on the display 164, and the user is not permitted to proceed with the testing of the balance of the circuits of the recreational vehicle 126, and is advised that the battery may be incapable of operating the emergency brake circuit 142 and may pose a safety risk. In a preferred embodiment, the term "Battery Dead" signifies that the battery should be charged with a stationary charger and retested. If following the retest of the battery a "Battery Good" term is not displayed on the display 164, the user is advised to change the battery of the recreational vehicle 126.

In a preferred embodiment, following the initial diagnostics of the battery of the recreational vehicle 126, and storage of the measured battery recovery profile in the variables table of the vehicle diagnostics code, the user proceeds with a first-time diagnosis of the remaining circuits of the recreational vehicle 126. To initiate the first-time diagnosis of the remaining circuits of the recreational vehicle 126, the user proceeds by depressing the circuit test switch 158, which signals the controller 106 to execute the vehicle diagnostics code resident in the memory 166. As with the battery test circuit 170, measured values for each of the remaining circuits of the recreational vehicle 126 need to be stored in the variables table resident in the memory 166 of the controller 106 before the DD 100 is able to perform an automated testing of the circuits of the recreational vehicle.

Upon execution of the diagnostics code, the controller 106 commands: the switching circuit 168 to switch in the first turn signal circuit 130; the voltage control circuit 172 to supply a voltage at a constant predetermined level; the timing circuit 174 to provide an interrupt signal to the switching circuit 168 at a predetermined rate, during an application of the constant voltage across the first turn signal circuit 130; and a current measurement circuit 176 to measure the current draw across the first turn signal circuit 130 while the constant voltage is being applied across the first turn signal circuit 130. The interrupt signal from the timing circuit 174 causes the switching circuit 168 to intermittently apply the constant voltage from the voltage control circuit 172 to the first turn signal circuit 130, which causes a turn signal bulb of the first turn signal circuit 130 to flash.

Upon a visual verification that the turn signal bulb of the first turn signal circuit 130 is flashing, the user depresses the information input switch 160 to store the measured operative current draw value in the variables table of the diagnostics code. In a preferred embodiment, during subsequent diagnostic testing of the first turn signal circuit 130, if the measured operative current draw value is within substantially 5% of the stored operative current draw value, the DD 100 records the first turn signal circuit 130 as being compliant. If the measured operative current draw value is not within substantially 5% of the stored operative current draw value, the DD 100 identifies the first turn signal circuit 130 as being non-compliant, and advises the user to confirm the non-compliance and change the bulb as needed. However, if upon visual confirmation the first turn signal circuit 130 is compliant, the DD 100 will permit depression of the information input switch 160 to replace the currently stored measured operative current draw value in the variables table of the diagnostics code with the value obtained during the subsequent test of the first turn signal circuit 130.

Once the measured operative current draw value of the first turn signal circuit 130 is stored in the variables table of the diagnostics code, the diagnostics code automatically proceeds with a confirmation testing of the operative status of the brake light circuit 132 as follows. The controller 106 commands: the switching circuit 168 to switch out the first turn signal circuit 130 and switch in the brake light circuit 132; the voltage control circuit 172 to supply a voltage at a constant predetermined level; the timing circuit 174 to provide an interrupt signal to the switching circuit 168 following a predetermined time, during an application of the constant voltage across the brake light circuit 132; and the current measurement circuit 176 to measure the current draw across the brake light circuit 132, while the constant voltage is being applied across the brake light circuit 132. The interrupt signal from the timing circuit 174 causes the switching circuit 168 to intermittently apply the constant voltage from the voltage control circuit 172 to the brake light circuit 132, which causes a brake light bulb of the brake light circuit 132 to alternate between being energized for a predetermined period of time and de-energized for a substantially shorter period of time.

Upon a visual verification that the brake light bulb of the brake light circuit 132 is illuminating properly; the user depresses the information input switch 160 to store the measured operative current draw value of the brake light circuit 132 in the variables table of the diagnostics code. In a preferred embodiment, during subsequent diagnostic testing of the brake light circuit 132, if the measured operative current draw value is within substantially 5% of the stored operative current draw value, the DD 100 records the brake light circuit 132 as being compliant. If the measured operative current draw value is not within substantially 5% of the stored operative current draw value, the DD 100 identifies the brake light circuit 132 as being non-compliant, and advises the user to confirm the non-compliance and change the bulb or bulbs as needed. However, if upon visual confirmation the brake light circuit 132 is compliant, the DD 100 will permit depression of the information input switch 160 to replace the currently stored measured operative current draw value of the brake light circuit 132 in the variables table of the diagnostics code, with the value obtained during the subsequent testing of the brake light circuit 132.

When the measured operative current draw value of the first turn signal circuit 130 and the operative current draw value of the brake light circuit 132 are safely stored in the variables table of the diagnostics code, the diagnostics code automatically proceeds with a confirmation testing of an operative status of the back-up light circuit 134 as follows. The controller 106 commands: the switching circuit 168 to switch out the brake light circuit 132 and switch in the back-up light circuit 134; the voltage control circuit 172 to supply a voltage at a constant predetermined level; the timing circuit 174 to provide an interrupt signal to the switching circuit 168 following a predetermined time duration, of applying the constant voltage across the back-up light circuit 134; and the current measurement circuit 176 to measure the current draw across the back-up light circuit 134, while the constant voltage is being applied across the back-up light circuit 134. The interrupt signal from the timing circuit 174 causes the switching circuit 168 to intermittently apply the constant voltage from the voltage control circuit 172 to the back-up light circuit 134, which causes a back-up light bulb of the back-up light circuit 134 to alternate between being energized for a predetermined period of time and de-energized for a substantially shorter period of time.

Upon a visual verification that a back-up light bulb of the back-up light circuit 134 is illuminating properly; the user depresses the information input switch 160 to store the measured operative current draw value of the back-up light circuit 134 in the variables table of the diagnostics code. In a preferred embodiment, during subsequent diagnostics testing of the back-up light circuit 134, if the measured operative current draw value is within substantially 5% of the stored operative current draw value, the DD 100 records the back-up light circuit 134 as being compliant. If the measured operative current draw value is not within substantially 5% of the stored operative current draw value, the DD 100 identifies the back-up light circuit 134 as being non-compliant, and advises the user to confirm the non-compliance and change the bulb or bulbs as needed. However, if upon visual confirmation the back-up light circuit 134 is compliant, the DD 100 will permit depression of the information input switch 160 to replace the currently stored measured operative current draw value of the back-up light circuit 134 in the variables table of the diagnostics code, with the value obtained during the subsequent testing of the back-up light circuit 134.

After the measured operative current draw values for: the first turn signal circuit 130; the brake light circuit 132; and the back-up light circuit 134 are each stored in the variables table of the diagnostics code, the diagnostics code automatically proceeds with a confirmation testing of an operative status of the flashing hazard warning circuit 136 as follows. The controller 106 commands: the switching circuit 168 to switch out the back-up light circuit 134 and switch in the flashing hazard warning circuit 136; the voltage control circuit 172 to supply a voltage at a constant predetermined level; the timing circuit 174 to provide an interrupt signal to the switching circuit 168 at a predetermined rate, during an application a constant voltage across the flashing hazard warning circuit 136; and the current measurement circuit 176 to measure the current draw across the flashing hazard warning circuit 136, while the constant voltage is being applied across the flashing hazard warning circuit 136. The interrupt signal from the timing circuit 174 causes the switching circuit 168 to intermittently apply the constant voltage from the voltage control circuit 172 to the flashing hazard warning circuit 136, which causes the turn signal bulb of the first turn signal circuit 130, and a second turn signal bulb of the flashing hazard warning circuit 136 to flash in unison.

Upon a visual verification that the first and second turn signal bulbs of the first turn signal circuit 130 and the flashing hazard warning circuit 136 are flashing properly; the user depresses the information input switch 160 to store the measured operative current draw value of the flashing hazard warning circuit 136 in the variables table of the diagnostics code. In a preferred embodiment, during subsequent diagnostic testing of the flashing hazard warning circuit 136, if the measured operative current draw value is within substantially 5% of the stored operative current draw value, the DD 100 records the flashing hazard warning circuit 136 as being compliant. If the measured operative current draw value is not within substantially 5% of the stored operative current draw value, the DD 100 identifies the flashing hazard warning circuit 136 as being non-compliant, and advises the user to confirm the non-compliance and change the bulb or bulbs as needed. However, if upon visual confirmation the flashing hazard warning circuit 136 is compliant, the DD 100 will permit depression of the information input switch 160 to replace the currently stored measured operative current draw value of the flashing hazard warning circuit 136 in the variables table of the diagnostics code, with the value obtained during the subsequent testing of the flashing hazard warning circuit 136.

With the measured operative current draw values for: the first turn signal circuit 130; the brake light circuit 132; the back-up light circuit 134; and the flashing hazard warning circuit 136 appropriately stored in the variables table of the diagnostics code, the diagnostics code automatically proceeds with a confirmation testing of an operative status of the running light circuit 138 (which includes a tail light) as follows. The controller 106 commands: the switching circuit 168 to switch out the flashing hazard warning circuit 136 and switch in the running light circuit 138; the voltage control circuit 172 to supply a voltage at a constant predetermined level; the timing circuit 174 to provide an interrupt signal to the switching circuit 168 following a predetermined time duration of applying the constant voltage across the running light circuit 138; and the current measurement circuit 176 to measure the current draw across the running light circuit 138 while the constant voltage is being applied across the running light circuit 138. The interrupt signal from the timing circuit 174 causes the switching circuit 168 to intermittently apply the constant voltage from the voltage control circuit 172 to the running light circuit 138, which causes running light and tail light bulbs of the running light circuit 138 to alternate between being energized for a predetermined period of time and de-energized for a substantially shorter period of time.

Upon a visual verification that the running light circuit 138 is illuminating properly; the user depresses the information input switch 160 to store the measured operative current draw value of the running light circuit 138 in the variables table of the diagnostics code. In a preferred embodiment, during subsequent diagnostic testing of the running light circuit 138, if the measured operative current draw value is within substantially 5% of the stored operative current draw value, the DD 100 records the running light circuit 138 as being compliant. If the measured operative current draw value is not within substantially 5% of the stored operative current draw value, the DD 100 identifies the running light circuit 138 as being non-compliant, and advises the user to confirm the non-compliance and change the bulb or bulbs of the running light circuit 138 as needed. However, if upon visual confirmation the running light circuit 138 is compliant, the DD 100 will permit depression of the information input switch 160 to replace the currently stored measured operative current draw value of the running light circuit 138 in the variables table of the diagnostics code, with the value obtained during the subsequent testing of the running light circuit 138.

With proper storage of the measured operative current draw values for: the first turn signal circuit 130; the brake light circuit 132; the back-up light circuit 134; the flashing hazard warning circuit 136; and the running light circuit 138 in the variables table of the diagnostics code, the diagnostics code automatically proceeds with a confirmation testing of an operative status of the emergency brake system circuit 142 as follows. The controller 106 commands: the switching circuit 168 to switch out the running light circuit 138 and switch in the emergency brake system circuit 142; the voltage control circuit 172 to supply a voltage at a constant predetermined level; the timing circuit 174 to provide an interrupt signal to the switching circuit 168 following a predetermined time duration, of applying the constant voltage across the emergency brake system circuit 142; and the current measurement circuit 176 to measure the current draw across the emergency brake system circuit 142, while the constant voltage is being applied across the emergency brake system circuit 142. The interrupt signal from the timing circuit 174 causes the switching circuit 168 to intermittently apply the constant voltage from the voltage control circuit 172 to the emergency brake system circuit 142, which causes a solenoid of the emergency brake system circuit 142 to alternate between being energized for a predetermined period of time and de-energized for a substantially shorter period of time.

Upon verification that the solenoid of the emergency brake system circuit 142 is properly engaging and disengaging; the user depresses the information input switch 160 to store the measured operative current draw value of the emergency brake system circuit 142 in the variables table of the diagnostics code. In a preferred embodiment, during subsequent diagnostic testing of the emergency brake system circuit 142, if the measured operative current draw value is within substantially 5% of the stored operative current draw value, the DD 100 records the emergency brake system circuit 142 as being compliant. If the measured operative current draw value is not within substantially 5% of the stored operative current draw value, the DD 100 identifies the emergency brake system circuit 142 as being non-compliant, and advises the user to confirm the non-compliance and change the solenoid or solenoids of the emergency brake system circuit 142 as needed. However, if upon confirmation the emergency brake system circuit 142 is compliant, the DD 100 will permit depression of the information input switch 160 to replace the currently stored measured operative current draw value of the emergency brake system circuit 142 in the variables table of the diagnostics code, with the value obtained during the subsequent testing of the emergency brake system circuit 142.

FIG. 3, further shows that in a preferred embodiment, a battery 178 is interposed between the voltage control circuit 172 and the controller 106, for use in assuring energy is made available to the memory 166 of the controller 106 during periods of non-use of the DD 100. Preferably, the battery will be formed from rechargeable cells (such as rechargeable lithium cells); have a battery life of five years without needing to be recharged; and be responsive to the voltage control circuit 172 for recharging during active use of the DD 100.

Figure 4:
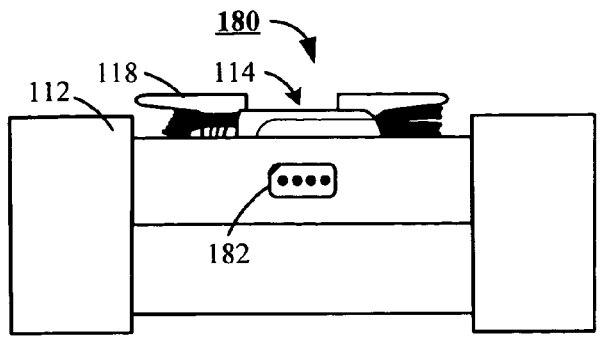
FIG. 4 illustrates a bottom elevational view of the diagnostics device of FIG. 1.

FIG. 4 shows that an alternate embodiment 180 of the DD 100 includes an optional male power receptacle 182. The inclusion of the optional male power receptacle 182 on the DD 180 permits usage of an external power source for instances when a battery is unavailable for testing circuits of the recreational vehicle 126, of FIG. 3. When an external power source is connected to the DD 180, the controller 106, of FIG. 3, recognizes the presence of the external power source and proceeds with testing the external power source as though it were the battery of the battery test circuit 170, of FIG. 3.

Upon confirmation that the external power source complies with the requirements for confirmation testing of the remaining circuits of the recreational vehicle 126, of FIG. 3, the DD 180 proceeds with circuit confirmation testing of the remaining circuits of the recreational vehicle 126, following substantially the same procedures as discussed hereinabove.

Figure 5:
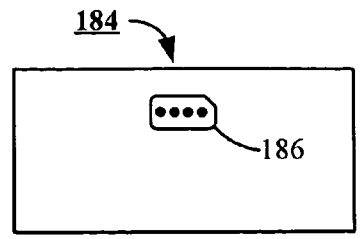
FIG. 5 provides a top plan view of an optional battery pack for the diagnostics device of FIG. 1
Figure 6:
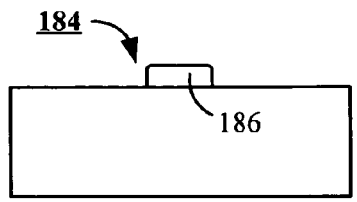
FIG. 6 illustrates a side elevational view of the optional battery pack of FIG. 5.

Preferably, the external power source is a rechargeable lithium battery supporting a female power receptacle, such as a rechargeable lithium battery 184 supporting a female power receptacle 186 shown by FIGS. 5 and 6. The rechargeable lithium battery 184 is preferably sized to accommodate the power requirements for a plurality of testing cycles of the circuits of the recreational vehicle 126. Preferably, if during compliant testing of the battery test circuit 170, the rechargeable lithium battery 184 lacks sufficient charge to complete confirmation testing of the circuits of the recreational vehicle 126, the controller 106, of FIG. 3, will direct the display driver 108, of FIG. 3, to display the term "Battery Dead." The user will not be permitted to continue with the testing of the balance of the circuits of the recreational vehicle 126, but rather is advised that the rechargeable lithium battery 184 should be charged with a stationary charger and retested. If following the retest of the rechargeable lithium battery 184 a "Battery Good" term is not displayed on the display 164, the user is advised to replace the rechargeable lithium battery 184.

Figure 7:
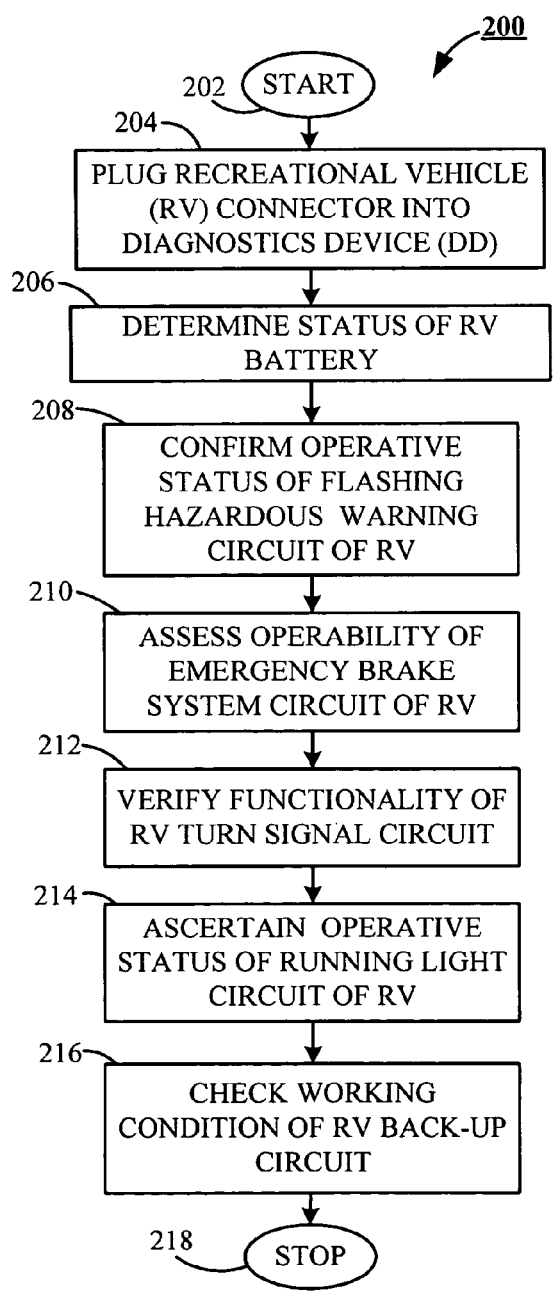
FIG. 7 is a flowchart of a method of using the diagnostics device of FIG. 1.

FIG. 7 shows a method 200 of using a diagnostics device for testing electrical circuits of a recreational vehicle, (such as shown by a first embodiment DD 100 of FIG. 1, or as shown by a second embodiment DD 180 of FIG. 4), commencing at start process step 202 and continuing at process step 204. At process step 204, a connector of a recreational vehicle, such as 126 of FIG. 3, is plugged into the diagnostics device to form electrical connections between contacts of the connector of a recreational vehicle, (such as 126), and each of a plurality of vehicle interface contacts, (such as 122 of the DD 100 of FIG. 2). The process continues at process step 206 with a determination of an operative status of a battery of a battery circuit, (such as 128 of FIG. 3). Confirmation of an operative status of a flashing hazard warning circuit, (such as 136 of FIG. 3), is attained at process step 208, while the operability of an emergency brake system circuit, (such as 142 of FIG. 3), is assessed at process step 210. At process step 212, a functionality of a first turn signal circuit (such as 130 of FIG. 3 is verified), and at process step 214 an operative status of a running light circuit (such as 138 of FIG. 3), is ascertained. It is noted that, in a preferred embodiment the running light circuit 138 includes a tail light affixed to the rear portion of the recreational vehicle. At process step 216, the working condition of a backup circuit of the recreational vehicle (such as 134 of FIG. 3), is checked, and the method 200 concludes at stop step 218.

Figure 8:
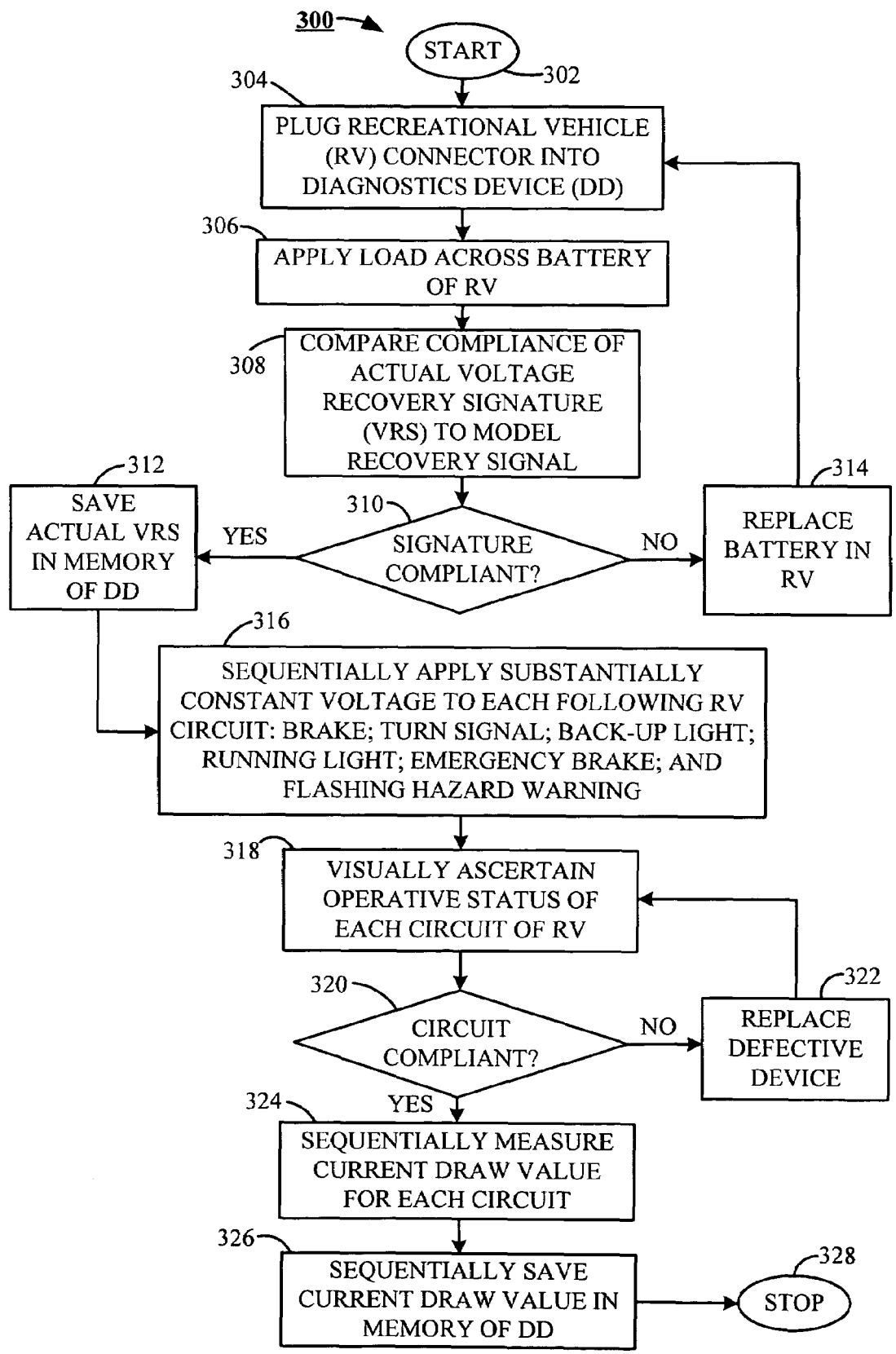
FIG. 8 is a flowchart of a method of programming the diagnostics device of FIG. 1, for use in confirming compliance of the electrical running circuits of the recreational vehicle of FIG. 3.

FIG. 8 shows a method 300 for use in setting up for automatic use a diagnostics device for testing electrical circuits of a recreational vehicle, (such as 100 of FIG. 1, or 180 of FIG. 4). The method 300 commences at start process step 302 and continues at process step 304. At process step 304, a connector of a recreational vehicle (such as 126 of FIG. 3), is plugged into the diagnostics device to form electrical connections between contacts of the connector of the recreational vehicle, and each of a plurality of vehicle interface contacts (such as 122 of FIG. 2). At process step 306, following confirmation of the type of battery present in a battery circuit (such as 128 of FIG. 3), (for example, whether the battery circuit is a 6, 12, or 45 volt system), a load of predetermined resistance is applied across the terminals of the battery for a predetermined period of time. At process step 308, an amount of time taken for the voltage of the battery to recover to a predetermined level (i.e., a measured voltage recovery signature) is compared to a model recovery signature supplied by the manufacturer of the battery. At process step 310, if the measured voltage recovery signature is in compliance with the model recovery signature, the process advances to process step 312. However, if the measured voltage recovery signature fails to be in compliance with the model recovery signature, the process continues with process step 314. At process step 314, the battery of the recreational vehicle is replaced and the process reverts to process step 304.

At process step 312, the measured voltage recovery signature is stored in a memory (such as 166 of FIG. 3), for use in subsequent testing of the battery circuit. At process step 316, a substantially constant voltage is sequentially applied to a plurality of circuits of the recreational vehicle to confirm compliance of each of the plurality of circuits to a predetermined criterion. Included among the plurality of circuits of the recreational vehicle are: a first turn signal circuit (such as 130); a brake light circuit (such as 132); a back-up light circuit (such as 134); a flashing hazard warning circuit (such as 136); a running light circuit (such as 138); and an emergency brake system circuit (such as 142). While each of the plurality of circuits of the recreational vehicle is undergoing the application of the substantially constant voltage, a visual confirmation of the operative status of each of the circuits undergoing testing is ascertained at process step 318.

At process step 320, a determination is made by the user of whether the particular circuit undergoing testing is in compliance. At process step 322, if the particular circuit undergoing testing is not in compliance, an identified defective device of that particular circuit is replaced and the process reverts to process step 318. However, if at process step 320 the user determines that the particular circuit undergoing testing is within compliance, the process continues to process step 324. At process step 324, an amount of current drawn by each particular circuit is measured during testing of that particular circuit, and at process step 326, if the particular circuit undergoing testing is in compliance, a value representing the amount of current drawn by each particular circuit undergoing testing is saved in a memory (such as 166 of FIG. 3), for use in subsequent testing of the circuits. Following the storage of each value representing the amount of current drawn by each circuit during the testing of each circuit, the method 300 concludes at stop process step 328.

As will be apparent to those skilled in the art, a number of modifications could be made to the preferred embodiments which would not depart from the spirit or the scope of the present invention. While the presently preferred embodiments have been described for purposes of this disclosure, numerous changes and modifications will be apparent to those skilled in the art. Such changes and modifications are encompassed within the spirit of this invention.

What is claimed is:

1. A device comprising:
  a printed circuit board assembly supporting a plurality of vehicle interface contacts;
  a controller programmed with vehicle diagnostics code, the controller mounted to the printed circuit board assembly and communicating with each vehicle interface contact; and
  a plurality of circuits of a recreational vehicle, each circuit communicating with a corresponding vehicle interface contact and operatively responsive to an execution by the controller of the vehicle diagnostics code, wherein the plurality of circuits comprise:
    a battery circuit selectively operating an emergency brake system circuit of the recreational vehicle, wherein the controller automatically detects a presence of a battery of the battery circuit and executes the diagnostic code to automatically determine a voltage and operative status of the battery; and
    a turn signal circuit with a repair of turn signal lights mounted to the exterior of the recreational vehicle, and wherein the controller selectively operates the turn signal circuit as a flashing hazard warning circuit.

2. The device of claim 1, further comprising:
  a status indicator communicating with the controller sequentially displaying the status of each circuit responding to the execution of the diagnostic code;
  a diagnostic code input contact communicating with the controller to initiate operation of the turn signal circuit as the flashing hazard warning circuit;
  a battery diagnostics input contact communicating with the controller to initiate diagnostics of the battery circuit; and
  an information input contact communicating with the controller to input identified values into variable fields of a table of the diagnostics code for each circuit of the plurality of circuits based on a measured response of each circuit to a signal individually applied to each circuit.

3. The device of claim 2, further comprising a battery test circuit communicating with the controller, the battery test circuit responding to commands from the controller called for by an execution of the diagnostic code provides signals to the controller to automatically determine the voltage and the operative status of the battery, and wherein the status indicator is a display.

4. The device of claim 3, further comprising:
  a voltage control circuit communicating with the controller controlling the voltage supplied to each of the plurality of circuits of the recreational vehicle while each said circuit sequentially undergoes a circuit specific compliance verification test in response to the execution by the controller of the vehicle diagnostics code; and
  a current measurement circuit reporting to the controller a current draw response of each said sequentially tested circuit during the circuit specific compliance verification test of each said circuit.

5. The device of claim 4, further comprising:
  a base-deck supporting the printed circuit board assembly;
  an emergency brake interface contact secured to the base-deck and interposed between the switching circuit and an emergency brake activation switch of the emergency brake system circuit;
  a top cover communicating with the base-deck providing an enclosure for the printed circuit board assembly; and
  a plurality of mechanical shock disbursement members attached to the enclosure absorbing externally applied impact forces.

6. The device of claim 5, further comprising:
  an input switch communicating with the diagnostics code input contact to sequentially initiate the circuit specific compliance verification test for each of the plurality of circuits of the recreational vehicle;
  a hazard warning switch communicating with the hazard warning input contact to initiate operation of the turn signal circuit as the flashing hazard warning circuit;
  a battery test switch communicating with the battery diagnostics input contact to initiate diagnostics of the battery circuit to automatically determine the voltage and the operative status of the battery; and
  an information input switch communicating with the information input contact to populate the variable fields of the diagnostics code with operative values for each of the plurality of circuits based on an individually measured response of each circuit responding to the signal individually applied to each said circuit.

7. The device of claim 3, further comprises:
  a switching circuit responsive to the controller directing the voltage supplied to each of the plurality of circuits of the recreational vehicle while each said circuit sequentially undergoes a circuit specific compliance verification test in response to the execution by the controller of the vehicle diagnostics code; and
  a timing circuit communicating with the controller and the switching circuit, the timing circuit controlling the duration and frequency of the voltage sequentially supplied to each of the plurality of circuits of the recreational vehicle while each said circuit undergoes its circuit specific compliance verification test.

8. The device of claim 7, further comprising:
  a base-deck supporting the printed circuit board assembly;
  an emergency brake interface contact secured to the base-deck and interposed between the switching circuit and an emergency brake activation switch of the emergency brake system circuit;
  a top cover communicating with the base-deck providing an enclosure for the printed circuit board assembly; and a plurality of mechanical shock disbursement members attached to the enclosure absorbing externally applied impact forces.

9. The device of claim 8, further comprising:
an input switch communicating with the diagnostics code input to sequentially initiate the circuit specific compliance verification test for each of the plurality of circuits of the recreational vehicle;
a hazard warning switch communicating with the hazard warning input contact to initiate operation of the turn signal circuit as the flashing hazard warning circuit;
a battery test switch communicating with the battery diagnostics input contact to initiate diagnostics of the battery circuit to automatically determine the voltage and the operative status of the battery; and
an information input switch communicating with the information input contact to populate the variable fields of the diagnostics code with operative values for each of the plurality of circuits based on an individually measured response of each circuit responding to the signal individually applied to each said circuit.

10. The device of claim 4, further comprising:
a switching circuit responsive to the controller sequentially directing the voltage supplied to each of the plurality of circuits of the recreational vehicle while each said circuit sequentially undergoes a circuit specific compliance verification test in response to the execution by the controller of the vehicle diagnostics code; and
a timing circuit communicating with the controller and the switching circuit, the timing circuit controlling the duration and frequency of the voltage sequentially supplied to each of the plurality of circuits of the recreational vehicle while each said circuit undergoes its circuit specific compliance verification test.

11. The device of claim 10, further comprising:
a base-deck supporting the printed circuit board assembly;
an emergency brake interface contact secured to the base-deck and interposed between the switching circuit and an emergency brake activation switch of the emergency brake system circuit;
a top cover communicating with the base-deck providing an enclosure for the printed circuit board assembly; and
a plurality of mechanical shock disbursement members attached to the enclosure absorbing externally applied impact forces.

12. The device of claim 11, further comprising:
an input switch communicating with the diagnostics code input contact to sequentially initiate the circuit specific compliance verification test for each of the plurality of circuits of the recreational vehicle;
a hazard warning switch communicating with the hazard warning input contact to initiate operation of the turn signal circuit as the flashing hazard warning circuit;
a battery test switch communicating with the battery diagnostics input contact to initiate diagnostics of the battery circuit to automatically determine the voltage and the operative status of the battery; and
an information input switch communicating with the information input contact to populate the variable fields of the diagnostics code with operative values for each of the plurality of circuits based on an individually measured response of each circuit responding to the signal individually applied to each said circuit.

13. The device of claim 9, in which the recreational vehicle is a livestock trailer.

14. The device of claim 9, in which the recreational vehicle is a utility trailer.

15. The device of claim 12, in which the recreational vehicle is a livestock trailer.

16. The device of claim 12, in which the recreational vehicle is a utility trailer.

17. A method by steps comprising:
plugging an electrical-systems utility plug of a recreational vehicle into an electrical system diagnostics device;
automatically determining with said electrical system diagnostics device whether a battery circuit of said recreational vehicle is a battery that is a candidate for replacement;
interposing an emergency brake interface contact between a switching circuit of said electrical system diagnostics device and an emergency brake activation switch of an emergency brake system circuit of said recreational vehicle;
assessing an operability of said emergency brake system circuit;
ascertaining an operative status of a running light circuit of said recreational vehicle, wherein said running light circuit comprises a tall light affixed to said recreational vehicle;
checking a working condition status of a back-up light circuit of said recreational vehicle;
confirming a turn signal circuit of said recreational vehicle cooperating with said electrical system of diagnostics device operates in combination to provide a flashing hazard warning circuit for said recreational vehicle; and
verifying a functionality of said turn signal circuit of said recreational vehicle.

18. The method of claim 17, in which the operative status of said battery is determined by steps comprising:
executing a battery circuit compliance verification test portion of a diagnostics code programmed into a controller of said electrical system diagnostics device;
measuring a voltage level of said battery with a battery test circuit of said electrical system diagnostics device, said battery test circuit communicating with said controller and responsive to an execution by said controller of said battery circuit compliance verification test portion of said diagnostics code;
applying a resistance across said battery for a duration of time, wherein said resistance and said duration of time is determined by said measured voltage level; and
monitoring a voltage response of said battery application of said resistance across said battery to determine an operative status of said battery.

19. The method of claim 17, in which said flashing hazard warning circuit is confirmed by steps comprising:
executing a flashing hazard warning circuit compliance verification test portion of a diagnostics code programmed into a controller of said electrical system diagnostics device;
applying a predetermined substantially constant voltage to said flashing hazard warning circuit;
measuring a value of a level of current draw across said flashing hazard warning circuit in response to said applied substantially constant voltage;
comparing said measured value of said level of current draw across said flashing hazard warning circuit to a predetermined value; and reporting compliance of said flashing hazard warning circuit when said measured value compares favorably with said predetermined value; else reporting non-compliance of said flashing hazard warning circuit when said measured value compares unfavorably with said predetermined value.

20. The method of claim 17, in which the operability of said emergency brake system circuit of said recreational vehicle is assessed by steps comprising:

executing an emergency brake system circuit compliance verification test portion of a diagnostics code programmed into a controller of said electrical system diagnostics device;

applying a predetermined substantially constant voltage to said emergency brake system circuit;

measuring a value of a level of current draw across said emergency brake system circuit in response to said applied substantially constant voltage;

comparing said measured value of said level of current draw across said emergency brake system circuit to a predetermined value; and reporting compliance of said emergency brake system circuit when said measured value compares favorably with said predetermined value; else reporting non-compliance of said emergency brake system circuit when said measured value compares unfavorably with said predetermined value.

21. The method of claim 17, in which said functionality of said turn signal circuit of said recreational vehicle is verified by steps comprising:

executing a turn signal circuit compliance verification test portion of a diagnostics code programmed into a controller of said electrical system diagnostics device;

applying a predetermined substantially constant voltage to said turn signal circuit;

measuring a value of a level of current draw across said turn signal circuit in response to said applied substantially constant voltage;

comparing said measured value of said level of current draw across said turn signal circuit to a predetermined value; and reporting compliance of said turn signal circuit when said measured value compares favorably with said predetermined value; else reporting non-compliance of said turn signal circuit when said measured value compares unfavorably with said predetermined value.

22. The method of claim 17, in which said operative status of said running light circuit of said recreational vehicle is ascertained by steps comprising:

executing a running light circuit compliance verification test portion of a diagnostics code programmed into a controller of said electrical system diagnostics device;

applying a predetermined substantially constant voltage to said running light circuit;

measuring a value of a level of current draw across said running light circuit in response to said applied substantially constant voltage;

comparing said measured value of said level of current draw across said running light circuit to a predetermined value; and reporting compliance of said running light circuit when said measured value compares favorably with said predetermined value; else reporting non-compliance of said running light circuit when said measured value compares unfavorably with said predetermined value.

23. The method of claim 17, in which said working condition of said back-up light circuit of said recreational vehicle is established by steps comprising:

executing a back-up light circuit compliance verification test portion of a diagnostics code programmed into a controller of said electrical system diagnostics device;

applying a predetermined substantially constant voltage to said back-up light circuit;

measuring a value of a level of current draw across said back-up light circuit in response to said applied substantially constant voltage;

comparing said measured value of said level of current draw across said back-up light circuit to a predetermined value; and reporting compliance of said back-up light circuit when said measured value compares favorably with said predetermined value; else reporting non-compliance of said back-up light circuit when said measured value compares unfavorably with said predetermined value.

24. A method by steps comprising:

plugging an electrical-systems utility plug of a recreational vehicle into an electrical system diagnostics device;

automatically determining an operative status of a battery of a battery circuit of said recreational vehicle with said electrical system diagnostics device;

confirming a turn signal circuit of said recreational vehicle cooperating with said electrical system diagnostics device operates in combination to provide a flashing hazard warning circuit for said recreational vehicle during an application of a substantially constant voltage across said flashing hazard warning circuit;

measuring a value of a current level draw by said flashing hazard warning circuit during said application of said substantially constant voltage; and storing said measured value in a variables table of a diagnostics code of said electrical system diagnostics device.

25. The method of claim 24, further comprising steps of:

interposing an emergency brake interface contact between a switching circuit of said electrical system diagnostics device and an emergency brake activation switch of an emergency brake system circuit of said recreational vehicle;

assessing a current draw signature of said emergency brake system circuit during a compliant operation of said emergency brake system circuit;

verifying a current draw signature of said turn signal circuit during a compliant operation of said turn signal circuit;

ascertaining a current draw signature of a running light circuit of said recreational vehicle during a compliant operation of said running light circuit; and establishing a current draw signature of a back-up light circuit of said recreational vehicle during a compliant operation of said back-up light circuit.

26. The method of claim 25, in which the operative status of said battery is determined by steps comprising:

executing a battery circuit compliance verification test portion of a diagnostics code programmed into a controller of said electrical system diagnostics device;

measuring a voltage level of said battery with a battery test circuit of said electrical system diagnostics device, said battery test circuit communicating with said controller and responsive to an execution by said controller of said battery circuit compliance verification test portion of said diagnostics code;

applying a resistance across said battery for a duration of time, wherein said resistance and said duration of time is determined by said measured voltage level; and monitoring a voltage response of said battery to said application of said resistance across said battery to determine an operative status of said battery.

27. The method of claim 25, in which said current draw signature of said emergency brake system is assessed by steps comprising:

executing an emergency brake system circuit compliance verification test portion of a diagnostics code programmed into a controller of said electrical system diagnostics device;

applying a predetermined substantially constant voltage to said emergency brake system circuit;

measuring a value of a level of current draw across said emergency brake system circuit in response to said applied substantially constant voltage; and storing said measured value of said level of current draw across said emergency brake system circuit in a variables table of diagnostics code of said electrical system diagnostics device as a predetermined value of said level of current draw across said emergency brake system circuit during said compliant operation of said emergency brake system circuit.

28. The method of claim 25, in which said current draw signature of said turn signal circuit of said recreational vehicle is verified by steps comprising:

executing a turn signal circuit compliance verification test portion of a diagnostics code programmed into a controller of said electrical system diagnostics device;

applying a predetermined substantially constant voltage to said turn signal circuit;

measuring a value of a level of current draw across said turn signal circuit in response to said applied substantially constant voltage; and storing said measured value of said level of current draw across said turn signal circuit in a variables table of a diagnostics code of said electrical system diagnostics device as a predetermined value of said level of current draw across said turn signal circuit during said compliant operation of said turn signal circuit.

29. The method of claim 25, in which said draw signature of said running light circuit of said recreational vehicle is ascertained by steps comprising:

executing a running light circuit compliance verification test portion of a diagnostics code programmed into a controller of said electrical system diagnostics device;

applying a predetermined substantially constant voltage to said running light circuit;

measuring a value of a level of current draw across said running light circuit in response to said applied substantially constant voltage; and storing said measured value of said level of current draw across said running light circuit in a variables table of a diagnostics code of said electrical system diagnostics device as a predetermined value of said level of current draw across said running light circuit during said compliant operation of said running light circuit.

30. The method of claim 25, in which said current draw signature of said back-up light circuit of said recreational vehicle is established by steps comprising:

executing a back-up light circuit compliance verification test portion of a diagnostics code programmed into a controller of said electrical system diagnostics device;

applying a predetermined substantially constant voltage to said back-up light circuit;

measuring a value of a level of current draw across said back-up light circuit in response to said applied substantially constant voltage; and storing said measured value of said level of current draw across said back-up light circuit in a variables table of a diagnostics code of said electrical system diagnostics device as a predetermined value of said level of current draw across said back-up light circuit during said compliant operation of said back-up light circuit.

* * * * *